United States Patent
Lazaridis et al.

(10) Patent No.: US 8,111,175 B2
(45) Date of Patent: *Feb. 7, 2012

(54) REDUCED KEYBOARD CHARACTER SELECTION SYSTEM AND METHOD

(75) Inventors: Mihal Lazaridis, Waterloo (CA); Jason T. Griffin, Waterloo (CA)

(73) Assignee: Research In Motion Limited, Waterloo, Ontario (CA)

(*) Notice: Subject to any disclaimer, the term of this patent is extended or adjusted under 35 U.S.C. 154(b) by 73 days.

This patent is subject to a terminal disclaimer.

(21) Appl. No.: 12/641,039

(22) Filed: Dec. 17, 2009

(65) Prior Publication Data

US 2010/0093406 A1  Apr. 15, 2010

Related U.S. Application Data

(63) Continuation of application No. 12/204,632, filed on Sep. 4, 2008, now Pat. No. 7,656,316, which is a continuation of application No. 11/733,111, filed on Apr. 9, 2007, now Pat. No. 7,492,286, which is a continuation of application No. 10/835,118, filed on Apr. 29, 2004, now Pat. No. 7,224,292.

(51) Int. Cl.
*H03K 17/94* (2006.01)
*H03M 11/00* (2006.01)

(52) U.S. Cl. .......... 341/22; 345/168; 379/93.27; 400/98

(58) Field of Classification Search .................... 341/22, 341/28; 345/168; 379/93.27, 93.18; 400/98
See application file for complete search history.

(56) References Cited

U.S. PATENT DOCUMENTS

| | | | |
|---|---|---|---|
| 4,459,049 A | 7/1984 | Howell et al. | |
| 4,737,980 A | 4/1988 | Curtin et al. | |
| 5,952,942 A | 9/1999 | Balakrishnan et al. | |
| 6,104,381 A | 8/2000 | Watanabe et al. | |
| 6,204,848 B1 | 3/2001 | Nowlan et al. | |
| 6,473,006 B1 | 10/2002 | Yu et al. | |
| 6,686,902 B2 | 2/2004 | Lee | |
| 6,885,318 B2 | 4/2005 | Bickerton | |
| 7,216,588 B2 | 5/2007 | Suess | |
| 7,224,292 B2 * | 5/2007 | Lazaridis et al. | 341/22 |

(Continued)

FOREIGN PATENT DOCUMENTS

WO  WO-01/31788 A1  5/2001

(Continued)

OTHER PUBLICATIONS

Communication in corresponding European Application No. 04010212.1 mailed by the European Patent Office on Dec. 6, 2004 (5 pages).

(Continued)

*Primary Examiner* — Timothy Edwards, Jr.
(74) *Attorney, Agent, or Firm* — Finnegan, Henderson, Farabow, Garrett & Dunner, LLP

(57) ABSTRACT

A system and method of selecting a character for display in a communication device having a display and a reduced-key keyboard is provided. One of the plurality of keys on the reduced-key keyboard is selected and a default letter associated with the selected key is displayed. A backspace key is selected to display a cursor in the position of the character on the display. The key associated with the default character is selected again and an alternate character associated with the selected key is displayed in place of the default letter.

20 Claims, 3 Drawing Sheets

U.S. PATENT DOCUMENTS

2003/0017858 A1  1/2003  Kraft et al.

FOREIGN PATENT DOCUMENTS

WO   WO-03/056784 A2   7/2003

OTHER PUBLICATIONS

Communication in corresponding European Application No. 04010212.1 mailed by the European Patent Office on Dec. 1, 2006 (5 pages).

Result of Consultation in corresponding European Application No. 04010212.1 mailed by the European Patent Office on Sep. 22, 2008 (8 pages).

Provision of Minutes in corresponding European Application No. 04010212.1 mailed by the European Patent Office on Oct. 15, 2008 (5 pages).

Decision in corresponding European Application No. 04010212.1 mailed by the European Patent Office on Oct. 22, 2008 (11 pages).

\* cited by examiner

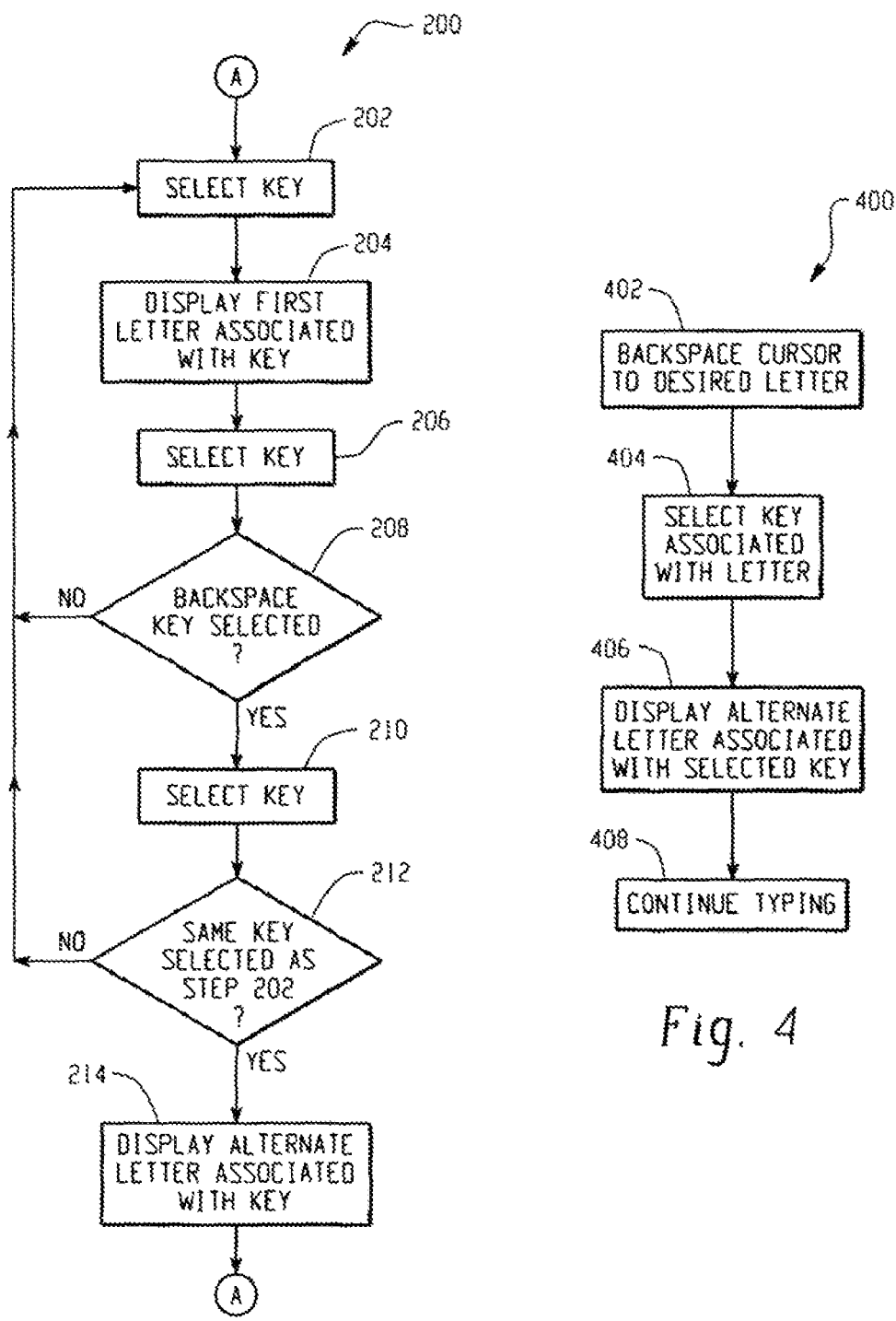

REDUCED KEYBOARD CHARACTER SELECTION SYSTEM AND METHOD

CROSS-REFERENCE TO RELATED APPLICATIONS

This application is a continuation of U.S. application Ser. No. 12/204,632, filed Sep. 4, 2008 now U.S. Pat. No. 7,656,316, which is a continuation of U.S. application Ser. No. 11/733,111, (now U.S. Pat. No. 7,492,286), filed Apr. 9, 2007, which is a continuation of U.S. application Ser. No. 10/835,118, (now U.S. Pat. No. 7,224,292), filed Apr. 29, 2004. Application Ser. No. 12/204,632, application Ser. No. 11/733,111 and U.S. application Ser. No. 10/835,118 are expressly incorporated herein by reference in their entirety.

FIELD

The technology described in this patent document relates generally to the field of reduced-key keyboards. More particularly, a system and method of selecting a letter for display in a communication device having a display and a reduced-key keyboard is described.

BACKGROUND

Keyboards (or keypads) having more than one letter key per physical key are known. These types of keyboards are referred to herein as reduced-key keyboards. An alphanumeric phone pad is an example of such a keyboard. For example, the "2" key on a traditional phone pad has three letters associated with it, the "A", "B", and "C" letters. One known technique for making a letter selection in such a reduced-key keyboard is to link the number of times a key is consecutively selected with one of the letter choices. Thus, in the case of the "2" key on the phone pad, a user would select the key once for the "A" letter, twice for the "B" letter, and three times for the "C" letter.

BRIEF DESCRIPTION OF THE DRAWINGS

FIG. 3 is a sample flow diagram of a method of selecting a letter associated with a reduced-key keyboard; and FIG. 4 is another sample flow diagram of a method of selecting a letter associated with a reduced-key keyboard.

DETAILED DESCRIPTION

Figure 1:
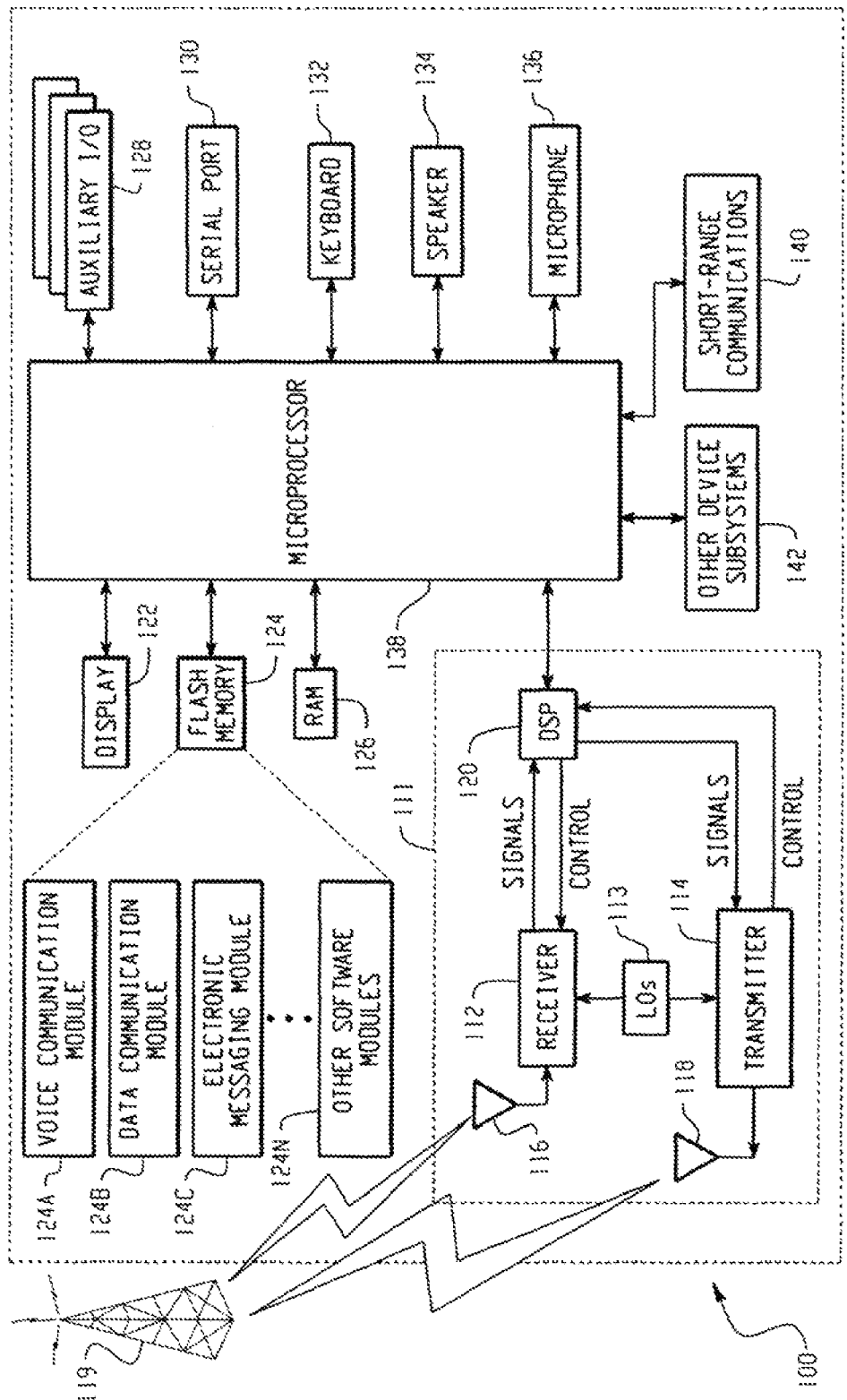
FIG. 1 is a block diagram of an exemplary mobile communication device that may incorporate the system and method described herein.

Turning now to the drawing figures, which describe one example of the invention described in this application, FIG. 1 is a block diagram of an exemplary mobile communication device that may incorporate the system and method described herein. The mobile communication device 100 includes a processing subsystem 138, a communications subsystem 111, a short-range communications subsystem 140, a memory subsystem 124, 126, and various other device subsystems and/or software modules 142. The mobile communication device 100 also includes a user interface, which may include a display 122, a serial port 130, keyboard 132, a speaker 134, a microphone 136, one or more auxiliary input/output devices 128, and/or other user interface devices.

The processing subsystem 138 controls the overall operation of the mobile communication device 100. Operating system software executed by the processing subsystem 138 may be stored in a persistent store, such as a flash memory 124, but may also be stored in other types of memory devices in the memory subsystem, such as a read only memory (ROM) or similar storage element. In addition, system software, specific device applications, or parts thereof, may be temporarily loaded into a volatile store, such as a random access memory (RAM) 126. Communication signals received by the mobile communication device 100 may also be stored to RAM 126.

The processing subsystem 138, in addition to its operating system functions, enables execution of software applications 124 on the device 100. A predetermined set of applications that control basic device operations, such as data and voice communications, may be installed on the device 100 during manufacture. In addition, a personal information manager (PIM) application, including an electronic messaging application, may be installed on the device. The PIM may, for example, be operable to organize and manage data items, such as email, calendar events, voice mails, appointments, and task items. The PIM application may also be operable to send and receive data items via the wireless network 119.

Communication functions, including data and voice communications, are performed through the communication subsystem 111, and possibly through the short-range communications subsystem 140. The communication subsystem 111 includes a receiver 112, a transmitter 114 and one or more antennas 116, 118. In addition, the communication subsystem 111 also includes a processing module, such as a digital signal processor (DSP) 120 or other processing device(s), and local oscillators (LOs) 113. The specific design and implementation of the communication subsystem 111 is dependent upon the communication network in which the mobile communication device 100 is intended to operate. For example, a mobile communication device 100 may include a communication subsystem 111 designed to operate within the Mobitex™ mobile communication system, the DataTAC™ mobile communication system, a GSM network, a GPRS network, a UMTS network, and/or an EDGE network.

Network access requirements vary depending upon the type of communication system. For example, in the Mobitex and DataTAC networks, mobile communication devices are registered on the network using a unique personal identification number or PIN associated with each device. In UMTS and GSM/GPRS networks, however, network access is associated with a subscriber or user of a device. A GPRS device therefore requires a subscriber identity module, commonly referred to as a SIM card, in order to operate on a GSM/GPRS network.

When required network registration or activation procedures have been completed, the mobile communication device 100 may send and receive communication signals over the communication network 119. Signals received by the antenna 116 from the communication network 119 are routed to the receiver 112, which provides signal amplification, frequency down conversion, filtering, channel selection, etc., and may also provide analog to digital conversion. Analog-to-digital conversion of the received signal allows the DSP to perform more complex communication functions, such as demodulation and decoding. In a similar manner, signals to be transmitted to the network 119 are processed (e.g., modulated and encoded) by the DSP 120 and are then provided to the transmitter 114 for digital to analog conversion, frequency up conversion, filtering, amplification and transmission to the communication network 119 (or networks) via the antenna 118.

In addition to processing communication signals, the DSP 120 provides for receiver 112 and transmitter 114 control. For example, gains applied to communication signals in the receiver 112 and transmitter 114 may be adaptively controlled through automatic gain control algorithms implemented in the DSP 120.

Figure 2:
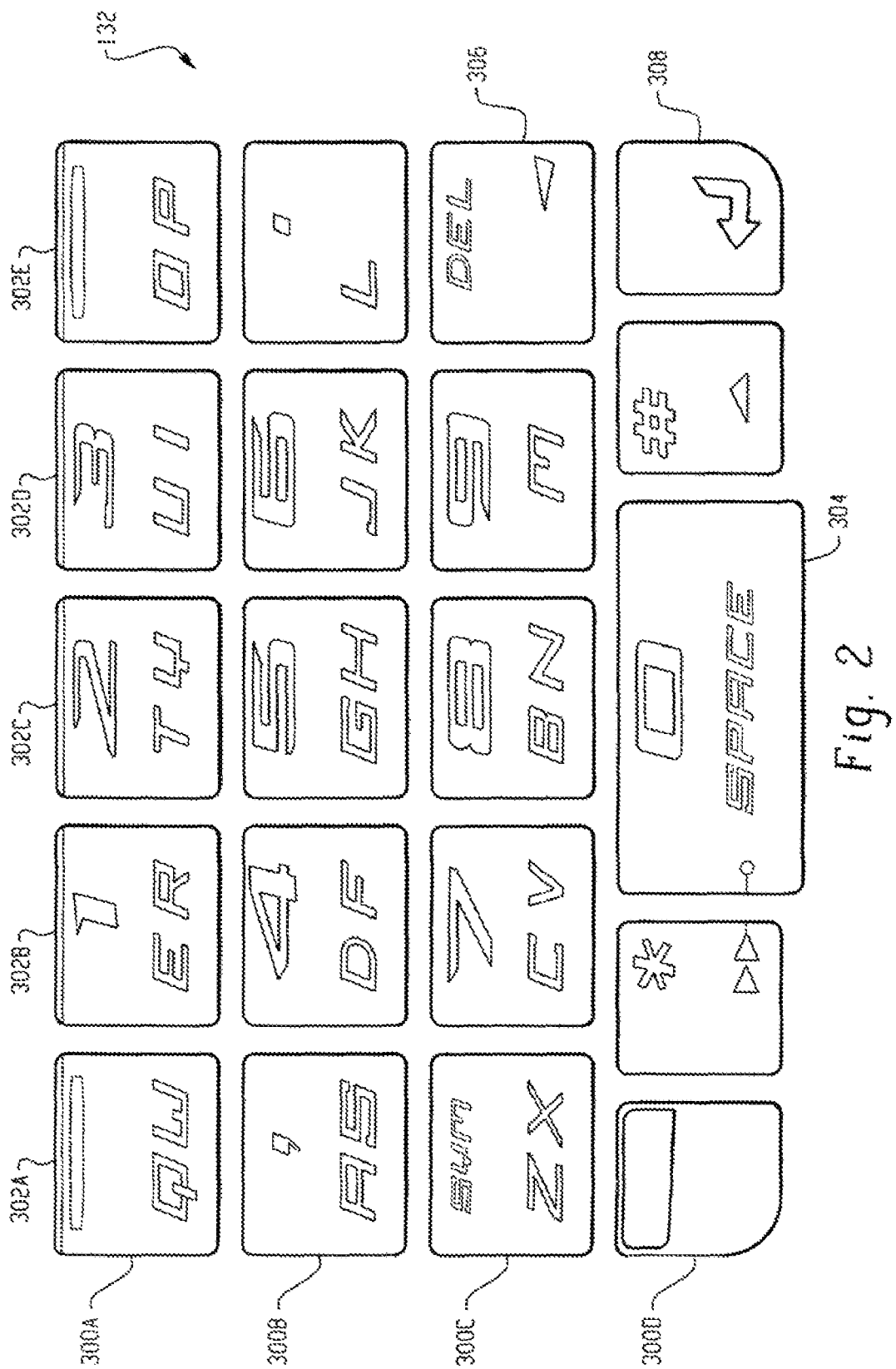
FIG. 2 is an exemplary reduced-key QWERTY keyboard for use with the mobile communication device shown in FIG. 1.

In a data communication mode, a received signal, such as a text message or web page download, is processed by the communication subsystem 111 and input to the processing device 138. The received signal is then further processed by the processing device 138 for output to a display 122, or alternatively to some other auxiliary I/O device 128. A device user may also compose data items, such as email messages, using a keyboard 138 and/or some other auxiliary I/O device 128, such as a touchpad, a rocker switch, a thumb-wheel, or some other type of input device. The composed data items may then be transmitted over the communication network 119 via the communication subsystem 111. The keyboard 132 may be a reduced-key QWERTY keyboard, such as shown in FIG. 2 below, in which there are fewer than 26 physical keys for receiving input selections for each of the 26 letters of the English alphabet. In this type of keyboard, some of the keys are associated with more than one character, examplarily letters. For example, the letters "D" and "F" occupy the same key in the keyboard shown in FIG. 2. For this keyboard layout, the "D" key may be the default letter selected by the device 100 when the key is selected and the "F" key may be an alternate letter selection. The methodology described below in connection with FIGS. 3 and 4 may be programmed into software operating on the device 100 to enable selection of the alternative letter.

In a voice communication mode, overall operation of the device is substantially similar to the data communication mode, except that received signals are output to a speaker 134, and signals for transmission are generated by a microphone 136. Alternative voice or audio I/O subsystems, such as a voice message recording subsystem, may also be implemented on the device 100. In addition, the display 122 may also be utilized in voice communication mode, for example to display the identity of a calling party, the duration of a voice call, or other voice call related information.

The short-range communications subsystem 140 enables communication between the mobile communication device 100 and other proximate systems or devices, which need not necessarily be similar devices. For example, the short-range communications subsystem 140 may include an infrared device and associated circuits and components, or a Bluetooth™ communication module to provide for communication with similarly-enabled systems and devices.

Although the teachings of this application are described with reference to the exemplary mobile communication device set forth in FIG. 1, it is to be understood that other types of mobile communication devices can be used, such as cellular telephones, two-way pagers, portable digital assistants, etc.

FIG. 2 is an exemplary reduced-key QWERTY keyboard for use with the mobile communication device shown in FIG. 1. The keyboard 132 preferably utilizes five columns 302A-302E and four rows 300A-300D to represent a reduced column QWERTY keyboard with an overlaid touch tone phone key arrangement. The four rows 3001-300D include a first row 300A, a second row 300B, a third row 300C, and a fourth row 300D. The five columns include a first column 302A, a second column 302B, a third column 302C, a fourth column 302D, and a fifth column 302E. FIG. 2 shows the touch tone phone key arrangement (numerals 1-9 and 0) as being centered between the columns. The first row 300A of keys includes in order the following key combinations for the text entry and telephony mode: "QW", "ER/1", "TY/2", "UI/3", and "OP". The second row 300B includes the following key combinations in order: "AS/,", "DF/4", "GH/5", "JK/6", and "L/.". The third row 300C includes the following key combinations in order: "ZX/sym", "CV/7", "BN/8", "M/9" and "backspace/delete." The "sym" function key pulls up a list of symbols that the user may input. The fourth row 300D includes the following key combinations in order: "alt", "next/*", "space/0", "shift/#", and "return (enter)". The keys in the top three rows 300A-300C are of uniform size while the keys in the fourth row 300D have a size that is different from the keys in the top three rows. In particular, the center "space" key 304 is larger than the other four keys in the row, with the other four keys having a similar size. The outermost keys in the fourth row 300D also have a more rounded shape, for aesthetic and other reasons. Each of the rows is straight and each of the columns is straight, with the keys in the fourth row 300D being mis-aligned with the five columns due to their different sizes.

In this reduced-key QWERTY keyboard 132, only two of the letter keys, the "L" and "M" letters are associated with a single physical key, the remaining letters are paired together and associated with a single physical key. Each physical key generates a single keystroke signal. Thus, if a user presses the "GH/5" key, it is not clear whether the user meant to select the "G" key or the "H" key. Preferably, the device is programmed to select the "G" key as the default letter selection and the "H" key as the alternate letter selection.

FIG. 3 is a sample flow diagram 200 of a method of selecting a letter associated with a reduced-key keyboard. The method may be used with a mobile device 100 having a reduced-key QWERTY keyboard, for example, such as the keyboard 132 shown in FIG. 2, in which many of the keys include a default letter or character and at least one alternate letter or character selection. At step 202, the user of the device 100 selects a letter key. The device then displays the default letter in step 204, which is typically the first letter associated with the selected key. For example, if the user selects the "D/F" key at column 302B and row 300B of FIG. 2, the device will typically display the first letter associated with that key as the default, which is the letter "D." The user then selects another key at step 206. At step 208, the device determines whether the user selected the backspace key 306 in step 206. If the user did not select the backspace key in step 206, then control passes back to step 204 and the default letter associated with the selected key is displayed. If, however, the user selected the backspace key 306, then control passes to step 210 and the user selects another key. The system then determines at step 212 if the user selected the same key in step 210 that was selected in step 202. If the key selected in step 212 is a different key than selected in step 202, then control passes to step 204 and the default letter associated with the selected key from step 212 is displayed in place of the default letter associated with the key selected in step 202. If, however, the user selected the same key in step 212 that was selected in step 202, then the system substitutes the alternate letter associated with the key selected in step 202 for the default letter in step 214 and control reverts to step 202 for a new letter selection.

Although in some embodiments each key may have only a single default letter and a single alternate letter—i.e., two letters per key—in other embodiments there may be more than two letters associated with some or all of the keys. In these embodiments, the system may perform an additional step after step 212 in which the system determines which of the two or more alternate letters should be substituted for the default letter. Consider, for example, that the user has typed the letters g-o-l-d, which form the word "gold." The user then backspaces over the "d" letter and hits a key that has the letters d-e-f associate with it. In this situation, the system would consult a dictionary or other database to determine that it should substitute the letter "f" instead of the letter "e" because of the probability that the user meant to type "golf" instead of "gole."

Various types and forms of "backspace" keys can be used with the methodology described herein. In the example of FIG. 2, above, the backspace key 306 is labelled with a back arrow symbol. In other embodiments the "backspace" functionality can be implemented with other types and forms of keys, such as a "clear" key, which may be labelled "C" or "CLR," for example. Other embodiments may include a soft key associated with a display screen, a touch screen key, or a navigation tool, such as a mouse or joystick selector.

FIG. 4 is another sample flow diagram 400 of a method of selecting a letter associated with a reduced-key keyboard. In this flow diagram, several letters have already been entered into the device 100. At step 402, the user selects the backspace key 306 one or multiple times in order to move a display cursor over a previously-selected letter. In step 404, the user then selects the same key that caused the previously-selected letter to be displayed on the display. At step 406 the system detects that the same key has been selected and an alternative letter is substituted on the display for the previously-selected letter. The user then continues typing at step 408. For example, a user may have typed the letters C-O-N-C-E-R-T, but actually meant to type the word CONVERT. Using the method described above, the user would backspace the cursor until it was positioned at the letter "C" between the letters "N" and "E" in the word CONCERT. The letter "C" may be deleted when this backspace operation occurs, or it may remain displayed but may be highlighted or otherwise modified in some manner. The user would then select the "C/V" key again, such as shown in FIG. 2 at column 302B and row 300C, which would cause the system to substitute the letter "V" on the display in place of the letter "C." The user would then proceed to type the remain letters in the word.

The above-described embodiments of the invention are intended to be examples only. Those of skill in the art may effect alterations, modifications and variations to the particular embodiments without departing from the scope of the invention. For example, although the system and method are described in connection with a reduced-key QWERTY keyboard having two letter keys per physical key, other keyboards could be used as well, such as phone-type keypads (non-QWERTY), or other types of QWERTY style or other style alphabetic keyboards having at least one key having a plurality of letters associated therewith. Other keyboard arrangements having multiple letters or characters per key may also benefit from the disclosed system and method of letter or character selection. Moreover, although described with reference to an example device as shown in FIG. 1, the methodology described herein can be used with any type of computing device having a reduced-key keyboard or keypad.

What is claimed is:

1. A mobile communication device comprising:
   a display;
   a keyboard having a plurality of input keys of which at least one is a multi-character key having at least a default character and an alternate character associated therewith, and a backspace key;
   a processing subsystem configurable to execute instructions from software applications stored on a memory subsystem, that when executed, the processing subsystem causes:
   displaying on the display the default character associated with one of the multi-character keys in response to receiving a selection of the multi-character key;
   deleting the default character on the display in response to receiving a selection of the backspace key;
   displaying the alternate character associated with the multi-character key in response to receiving a subsequent selection of the multi-character key.

2. The mobile communication device as recited in claim 1, wherein the default character and the alternate character associated with the multi-character key comprise a first letter and a second letter.

3. The mobile communication device as recited in claim 2, wherein the multi-character key further comprises at least one numeric character.

4. The mobile communication device as recited in claim 1, wherein the default character and the alternate character associated with the multi-character key comprise at least one letter.

5. The mobile communication device as recited in claim 4, wherein the default character and the alternate character associated with the multi-character key further comprises at least one numeric character.

6. The mobile communication device as recited in claim 1, further comprising an enter key.

7. The mobile communication device as recited in claim 1, wherein the backspace key corresponds to one of a clear key, a 'C' key, a 'CLR' key, a soft key, a touch screen key, a navigation tool, a mouse, and a joystick selector.

8. The mobile communication device as recited in claim 1, wherein the software applications further comprise instructions for positioning a cursor over the alternate character on the display when a request to move the cursor to a previously entered character is received and to display a different alternate character associated with the multi-character key in response to receiving an additional selection of the multi-character key.

9. The mobile communication device as recited in claim 1, wherein said display is a touch screen.

10. The mobile communication device as recited in claim 9, wherein the keyboard is displayed by the touch screen.

11. The mobile communication device as recited in claim 1, wherein the keyboard is a reduced-key keyboard having keys with a QWERTY alphabetic letter arrangement.

12. The mobile communication device as recited in claim 11, wherein the QWERTY alphabetic letter arrangement comprises fourteen letter keys, the fourteen letter keys including twenty-six letter indicia.

13. The mobile communication device as recited in claim 12, wherein the fourteen letter keys are organized into three rows of letter keys, a first row comprising five letter keys, a second row comprising five letter keys and a third row comprising four letter keys.

14. The mobile communication device as recited in claim 13, further comprising a backspace key positioned in the third row of letter keys.

15. The mobile communication device as recited in claim 14, wherein the reduced-key keyboard further comprises a numeric phone pad overlaid on the QWERTY alphabetic letter arrangement and centered on the three rows of letter keys.

16. The mobile communication device as recited in claim 11, wherein the reduced-key keyboard is a touch-tone phone pad.

17. A method of selecting a character for display on a display of a communication device, said communication device having a keyboard having a plurality of input keys of which at least one is a multi-character key having at least a default character, an alternate character and a backspace key associated therewith, the method comprising:
   displaying on the display the default character associated with one of the multi-character keys in response to receiving a selection of the multi-character key;
   deleting the default character on the display in response to receiving a selection of the backspace key;
   displaying the alternate character associated with the multi-character key in response to receiving a subsequent selection of the multi-character key.

18. The method as recited in claim 17, further comprising positioning a cursor over the alternate character on the display when a request to move the cursor to a previously entered character is received and to display a different alternate character associated with the multi-character key in response to receiving an additional selection of the multi-character key.

19. A method of selecting a character for display in a communication device having a display screen and plurality of user inputs including a reduced-key keyboard comprising a plurality of input keys of which at least one is a multi-character key associated with a plurality of characters, the method comprising the steps of:
   selecting one of a plurality of input keys on the reduced-key keyboard and displaying a default character associated with the selected key;
   selecting at least one time a user input for inputting a request to move cursor to a previously entered character and displaying a cursor in the position of the default character on the display screen; and
   selecting the selected key and displaying an alternate character associated with the selected key.

20. A processing subsystem configured to be installed in a mobile communication device comprising a user interface including a display screen and a plurality of user inputs including a reduced-key keyboard comprising a plurality of input keys of which at least one is a multi-character key associated with a plurality of alphanumeric characters, said processing subsystem comprising:
   control software programmed to display a default character associated with a selected multi-character key upon a first actuation thereof and to display a cursor in the position of the default character on the display screen when a user input for inputting a request to move the cursor to a previously entered character is subsequently actuated at least one time and to then display an alternate character associated with the selected multi-character key upon a second actuation of the multi-character key.

* * * * *